United States Patent
Tateoka et al.

(10) Patent No.: US 7,276,975 B2
(45) Date of Patent: Oct. 2, 2007

(54) TRANSISTOR INTEGRATED CIRCUIT APPARATUS

(75) Inventors: Kazuki Tateoka, Takatsuki (JP); Katsushi Tara, Kyoto (JP); Kaname Motoyoshi, Nishinomiya (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 163 days.

(21) Appl. No.: 11/194,465

(22) Filed: Aug. 2, 2005

(65) Prior Publication Data

US 2006/0043516 A1 Mar. 2, 2006

(30) Foreign Application Priority Data

Aug. 27, 2004 (JP) ............................. 2004-249123

(51) Int. Cl.
*H03F 3/191* (2006.01)
(52) U.S. Cl. ...................................... 330/302; 330/307
(58) Field of Classification Search ................ 330/295, 330/302
See application file for complete search history.

(56) References Cited

U.S. PATENT DOCUMENTS 5,608,353 A   3/1997  Pratt
6,897,732 B2 * 5/2005  Iwai ........................... 330/302
2004/0145415 A1 * 7/2004  Sun ............................. 330/295

\* cited by examiner

*Primary Examiner*—Steven J. Mottola
(74) *Attorney, Agent, or Firm*—McDermott Will & Emery LLP (57) ABSTRACT

A transistor integrated circuit apparatus generating less noise, having superb RF characteristics, and preventing thermal runaway of transistors is provided. Owing to capacitors C11 through C1$n$ having one end commonly connected to an RF signal input terminal RFin and the other end connected to a base electrode of a corresponding transistor, and inductors L11 through L1$n$ having one end commonly connected to a DC power supply input terminal DCin and the other end connected to a base electrode of a corresponding transistor, RF noise generated in a DC power supply circuit is reduced. This can reduce the RF noise output from the transistors Tr11 through Tr1$n$. The inductors L11 through L1$n$ prevent an RF signal input from the RF input terminal RFin from flowing toward the DC power supply circuit. This can prevent the RF signal from being lost by the flow thereof toward the DC power supply circuit.

4 Claims, 7 Drawing Sheets

TRANSISTOR INTEGRATED CIRCUIT APPARATUS

BACKGROUND OF THE INVENTION

1. Field of the Invention

The present invention relates to a transistor integrated circuit apparatus, and more specifically to a transistor integrated circuit apparatus usable for, for example, a power transistor circuit for amplifying an RF signal.

2. Description of the Background Art

For a transistor circuit for amplifying an RF signal, a circuit including a plurality of transistors (for example, hetero-junction bipolar transistors) connected in parallel is conventionally used in order to guarantee good RF characteristics.

Figure 4:
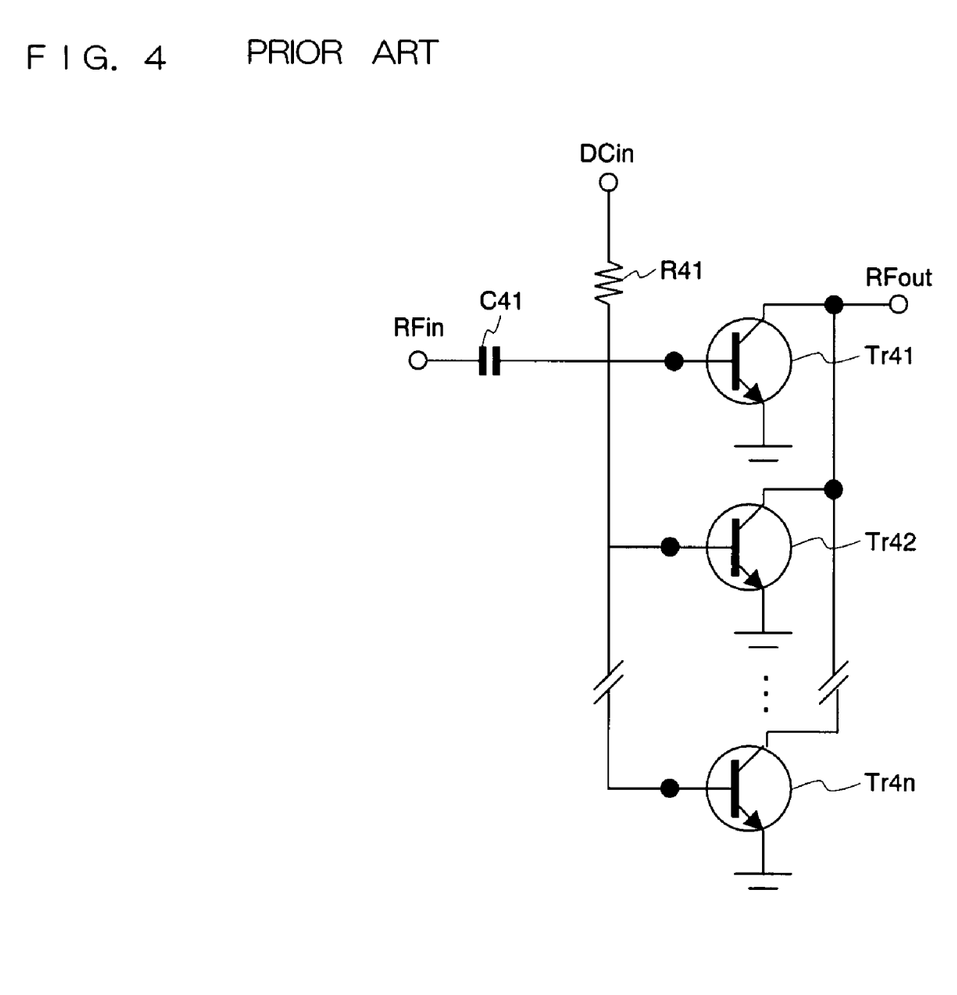
FIG. 4 show a circuit configuration of a conventional power transistor circuit.

For example, a circuit shown in FIG. 4 is conventionally used as a power transistor circuit. The power transistor shown in FIG. 4 includes n number of transistors Tr41 through Tr4n, a bias resistor R41, a capacitor C41, a DC power supply input terminal DCin, a RF signal input terminal RFin, and a RF signal output terminal RFout.

In the power transistor circuit shown in FIG. 4, a DC voltage (bias voltage) is applied to a base electrode of each of the transistors Tr41 through Tr4n via the common bias resistor R41. An RF signal is also input to the base electrode of each of the transistors Tr41 through Tr4n from the RF signal input terminal RFin via the capacitor C41. An emitter electrode of each of the transistors Tr41 through Tr4n is grounded. A collector electrode of each of the transistors Tr41 through Tr4n is commonly connected to the RF signal output terminal RFout. An output signal from each of the transistors Tr41 through Tr4n is output to the outside of the circuit via the RF signal output terminal RFout.

The power transistor circuit shown in FIG. 4 has an ideal circuit configuration which is designed assuming that there is no variance in the characteristics among the transistors. Since there are, however, variances in the characteristics among the transistors in actuality, variances occur in the operation of the transistors. Therefore, in the power transistor circuit shown in FIG. 4, a part of the transistors may cause thermal runaway due to an excessive amount of heat generated during the operation. When a transistor causes thermal runaway, the transistor is deteriorated or damaged and this causes malfunction of the circuit.

Figure 5:
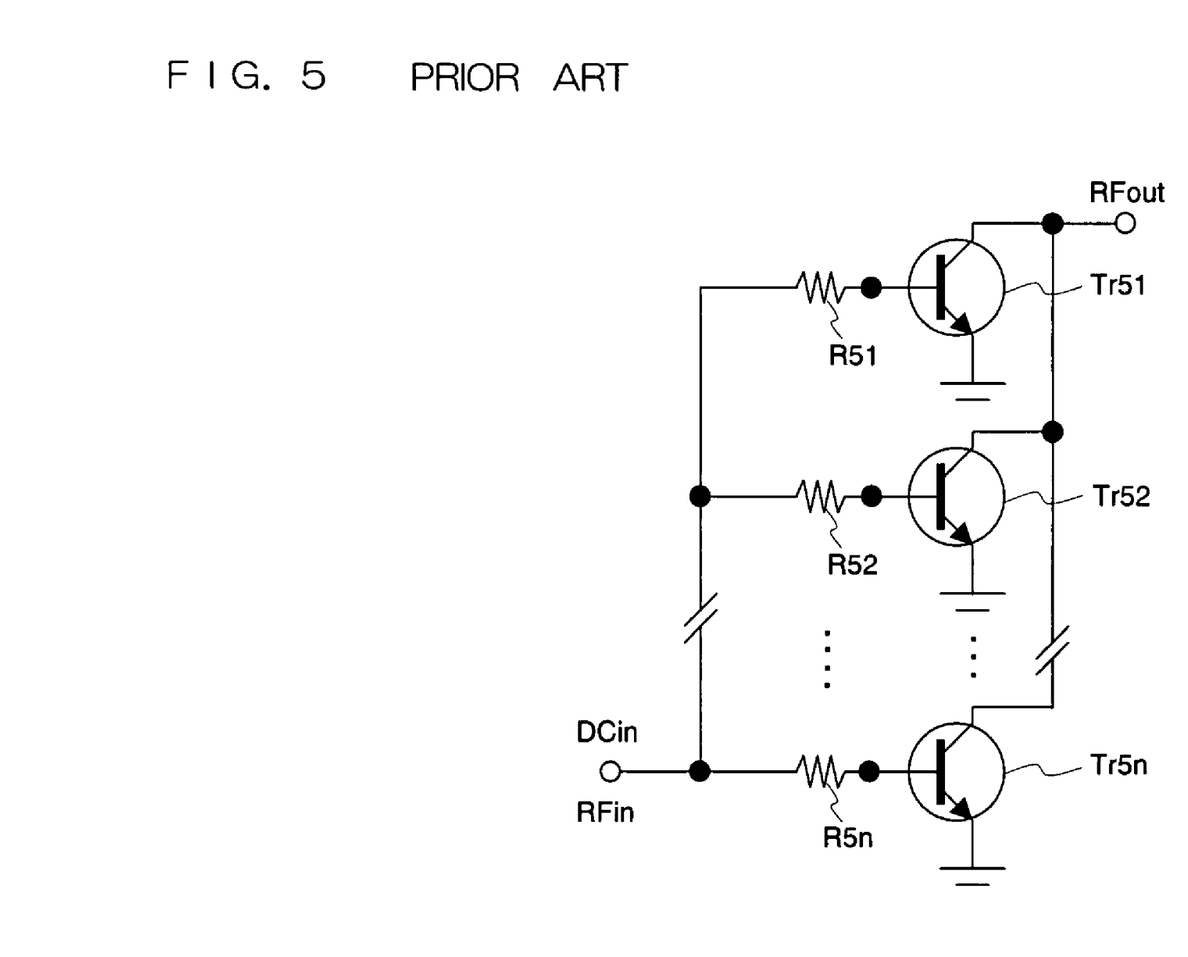
FIG. 5 show a circuit configuration of another conventional power transistor circuit.

In order to solve the above-described problem, a power transistor circuit shown in FIG. 5 is conventionally used. The power transistor circuit shown in FIG. 5 includes n number of transistors Tr51 through Tr5n, n number of bias resistors R51 through R5n, a DC power supply input terminal DCin, a RF signal input terminal RFin, and a RF signal output terminal RFout.

In the power transistor circuit shown in FIG. 5, the bias resistors R51 through R5n are respectively connected to base electrodes of the transistors Tr51 through Tr5n. Owing to such a configuration, an increase in the base current in each transistor is suppressed even when the temperature of the transistor is excessively raised. This prevents thermal runaway of the transistors Tr51 through Tr5n. However, in the circuit shown in FIG. 5, an RF signal flows through the bias resistors R51 through R5n, which lowers the gain. For this reason, the circuit configuration shown in FIG. 5 is not suitable for a power transistor circuit.

Figure 6:
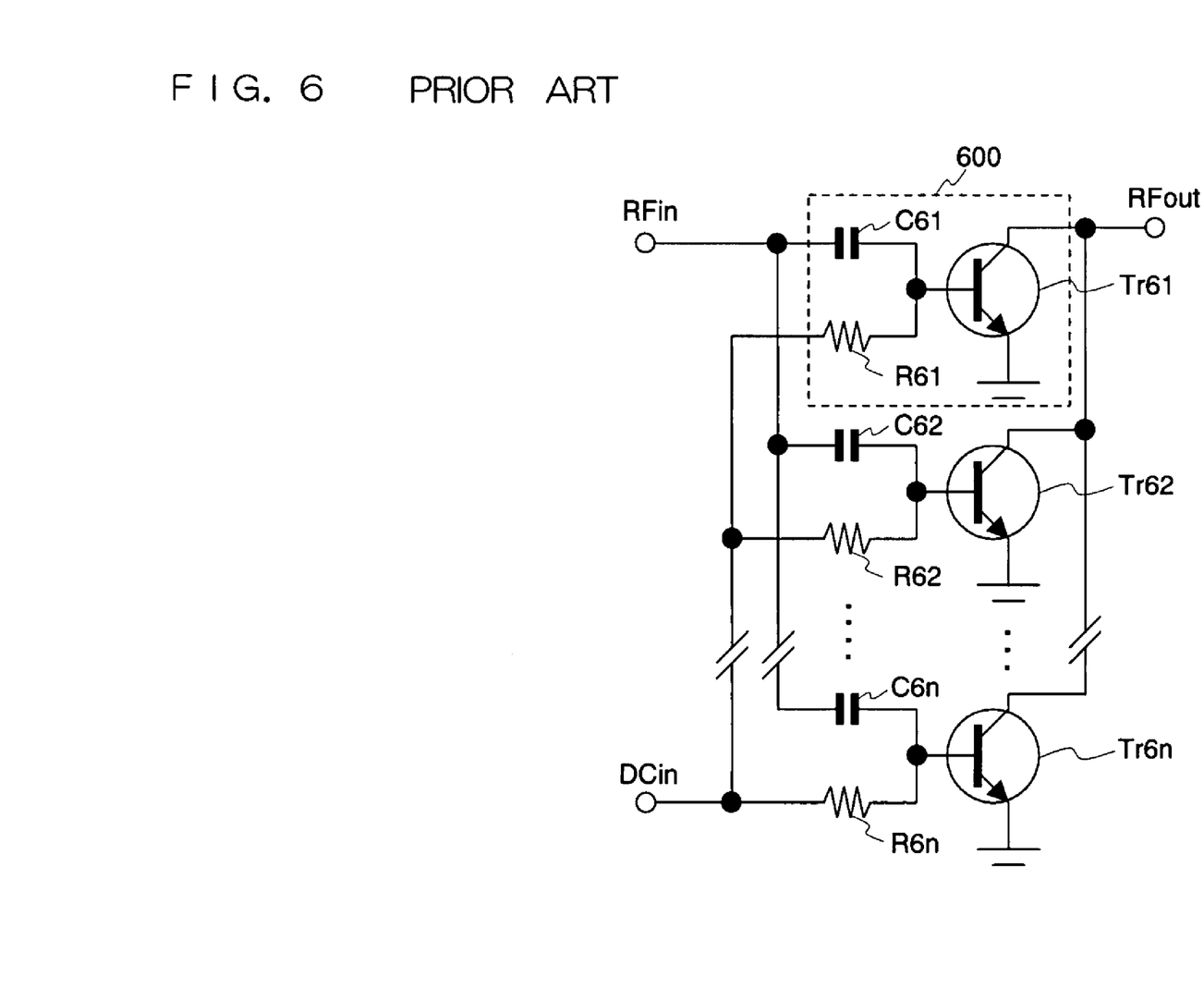
FIG. 6 show a circuit configuration of still another conventional power transistor circuit.

A method for dividing a power transistor circuit into cells is proposed in the specification of U.S. Pat. No. 5,608,353. FIG. 6 shows a circuit configuration of the power transistor circuit described in U.S. Pat. No. 5,608,353. The circuit shown in FIG. 6 includes n number of cells, each including a transistor circuit, connected in parallel. For example, a cell 600 includes a transistor Tr61, a capacitor C61, and a bias resistor R61.

A base electrode of the transistor Tr61 is connected to one end of the capacitor C61 and one end of the bias resistor R61. The other end of the capacitor C61 is connected to an RF signal input terminal RFin. The other end of the bias resistor R61 is connected to a DC power supply input terminal DCin. The Base electrode of the transistor Tr61 is supplied with a bias current from a DC power supply circuit (not shown) via the bias resistor R61. The base electrode of the transistor Tr61 also receives an RF signal which is input via the capacitor C61. The other cells have substantially the same configuration as the cell 600. In the following description, the elements included in the cell 600 will be used to describe the operation of the conventional power transistor circuit shown in FIG. 6.

In this power transistor circuit, the bias resistor R61 is connected to the transistor Tr61. Owing to such a configuration, when the temperature in the transistor Tr61 is excessively raised, an increase in the base current in the transistor Tr61 is suppressed. This prevents thermal runaway of the transistor Tr61, and thus prevents the transistor Tr61 from being deteriorated or damaged due to the thermal runway.

In this power transistor circuit, an RF signal is input to the transistor Tr61 without passing through the bias resistor R61. Therefore, the gain is not lowered by the bias resistor R61, unlike in the power transistor circuit shown in FIG. 5.

In the power transistor circuit shown in FIG. 6, a base electrode of the transistor Tr61 is connected to the DC power supply circuit via the bias resistor R61. The DC power supply circuit usually uses a transistor formed on a semiconductor substrate on which the power transistor circuit is provided.

The power transistor circuit shown in FIG. 6 has the following problem. The transistor included in the DC power supply circuit has a gain in a wide band ranging from the DC band to the RF band. Therefore, RF noise generated in the DC power supply circuit is input to the transistor Tr61, and is output from the transistor Tr61 in an amplified state. In addition, depending on the type of the bias resistor R61, thermal noise generated in the bias resistor R61 may be a problem.

Generally in a power transistor circuit for amplifying an RF signal, a large magnitude of current occasionally flows to the collector of the transistor. At this point, a large magnitude of current also flows to the base of the transistor for an instant. In the power transistor circuit shown in FIG. 6, when a large magnitude of current flows to the base, the bias voltage is lowered by the bias resistor, which lowers the base potential. When the base potential is lowered, the operation state of the power transistor circuit becomes close to the class B operation. As a result, harmonics are generated in the collector current, and thus the peak voltage of the collector current is increased for an instant. This deteriorates the RF characteristics of the transistor; and in the worst case, damages the transistor.

SUMMARY OF THE INVENTION

Therefore, an object of the present invention is to provide a transistor integrated circuit apparatus generating less noise, having superb RF characteristics, and preventing thermal runaway of a transistor included therein.

A transistor integrated circuit apparatus according to the present invention comprises at least one transistor having a first electrode connected to a common output terminal and a second electrode which is grounded; at least one capacitor having one of two electrodes connected to a base electrode of the transistor and the other electrode connected to a common RF signal input terminal; and at least one inductor having one of two electrodes connected to the base of the transistor and the other electrode connected to a DC power supply input terminal.

The inductor preferably has a sufficient resistance component as a bias resistor.

The inductor is preferably formed of a material having a resistivity which has a positive temperature coefficient.

The inductor may be formed of a metal thin film.

At least one of the inductor and at least one of the capacitor corresponding to each other are preferably integrally formed of the same metal.

The transistor integrated circuit apparatus according to the present invention preferably further comprises another inductor between at least one of the inductor and a DC power supply circuit for supplying a DC power supply.

A transistor integrated circuit apparatus according to the present invention comprises at least one transistor having a first electrode connected to a common output terminal and a second electrode which is grounded; at least one capacitor having one of two electrodes connected to a base electrode of the transistor and the other electrode connected to a common RF signal input terminal; and at least one inductor having one of two electrodes connected to the base of the transistor and the other electrode connected to a DC power supply input terminal. Owing to this configuration, RF noise generated in a DC power supply circuit can be reduced by the inductor, and thus the RF noise output from the transistor can be reduced. The inductor prevents an RF signal input from the RF signal input terminal from flowing toward the DC power supply circuit. Thus, the RF signal can be prevented from being lost by the flow thereof toward the DC power supply circuit. In addition, in the transistor integrated circuit apparatus according to the present invention, the base electrode of each transistor and the DC power supply circuit are separated from each other by the inductor in the high frequency range. Therefore, a reduction in the base potential is suppressed when the amplitude of the output signal is excessively large, and an accompanying increase in the collector current and the collector voltage can be suppressed. Thus, the deterioration of, and the damages to, the transistor caused by the increase in the collector current and the collector voltage can be prevented.

The inductor has a sufficient resistance component as a bias resistor and is formed of a material having a resistivity which has a positive temperature coefficient. Therefore, an increase in the base current of the transistor is suppressed even when the temperature of the transistor is excessively raised. Thus, thermal runaway of the transistors caused by the variance among the transistors can be prevented.

At least one of the inductor and at least one of the capacitor corresponding to each other are preferably integrally formed of the same metal. This can reduce the size of the transistor integrated circuit apparatus.

The transistor integrated circuit apparatus according to the present invention further comprises an other inductor between at least one of the inductor and a DC power supply circuit. Therefore, the DC power supply circuit and the base electrode of each transistor can be better separated from each other in the high frequency range.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1A:
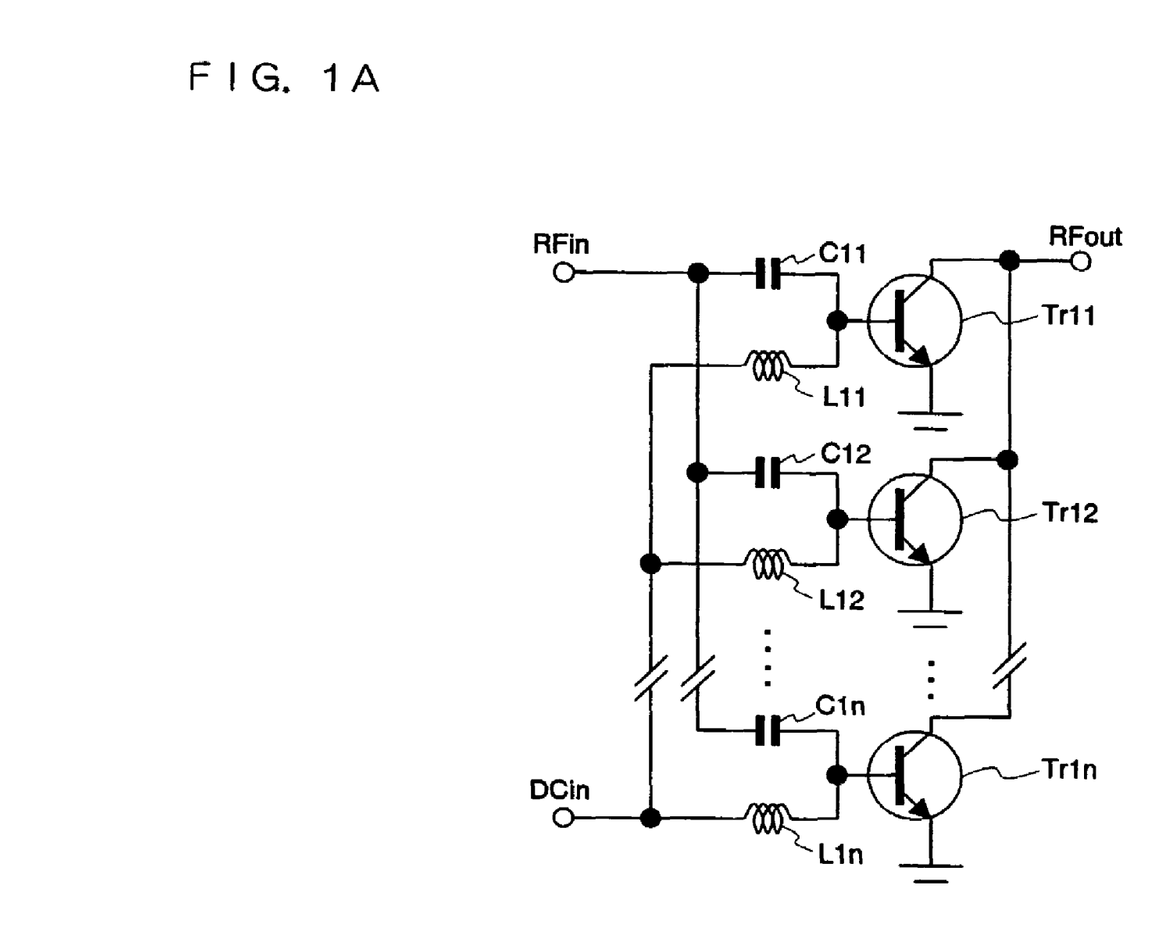
FIGS. 1A and 1B each show a circuit configuration of a transistor integrated circuit apparatus according to a first embodiment of the present invention.

FIG. 1A is a circuit diagram of a transistor integrated circuit apparatus according to a first embodiment of the present invention. The transistor integrated circuit apparatus shown in FIG. 1A includes n number of transistors Tr11 through Tr1$n$, n number of capacitors C11 through C1$n$, n number of inductors L11 through L1$n$, a DC power supply input terminal DCin, an RF signal input terminal RFin, and an RF signal output terminal RFout. The transistor integrated circuit apparatus shown in FIG. 1A is entirely formed on one semiconductor substrate.

A base electrode of the transistor Tr11 is connected to one end of the capacitor C11 and one end of the inductor L11. The other end of the capacitor C11 is connected to the RF signal input terminal RFin. The other end of the inductor L11 is connected to the DC power supply input terminal DCin. A collector electrode of the transistor Tr11 is connected to the RF signal output terminal RFout, and an emitter electrode of the transistor Tr11 is grounded. The base electrode of the transistor Tr11 is supplied with a bias current from a DC power supply circuit (not shown) via the inductor L11. The base electrode of the transistor Tr11 is also supplied with an RF signal via the capacitor C11. The other transistors, capacitors and inductors have substantially the same configuration as that of the transistor Tr11, the capacitor C11 and the inductor L11. In the following description, the transistor Tr11, the capacitor C11 and the inductor L11 will be used to describe the transistor integrated circuit apparatus according to the first embodiment.

The transistor integrated circuit apparatus according to the first embodiment includes the inductor L11 between the transistor Tr11 and the DC power supply circuit. Owing to such a configuration, RF noise generated in the DC power supply circuit is reduced. Thus, noise included in an output signal from the transistor Tr11 can be reduced.

The inductor L11 has a high impedance with respect to an RF signal, and therefore prevents an RF signal input from the RF signal input terminal RFin from flowing toward the DC power supply circuit. Thus, the RF signal can be prevented from being lost by the flow thereof toward the DC power supply circuit.

Generally in a power transistor circuit, a large magnitude of current flows through the collector of the transistor when a signal having a high amplitude is output. At this point, the current flowing through the base of the transistor obtains an amplitude corresponding to that of the collector current. In the conventional power transistor circuit shown in FIG. 6, such an amplitude of the base current changes the base potential and thus lowers the average level of the base potential. When the base potential is lowered, the operation point of the transistor is lowered and thus the operation of the transistor becomes like the class B operation. As a result, harmonics are generated in the collector current, and thus the collector current and the collector voltage are increased for an instant. Such an increase in the collector current and the collector voltage for an instant deteriorates or damages the transistor.

By contrast, in a power transistor using the transistor integrated circuit apparatus according to the first embodiment, the base electrode of each transistor and the DC power supply circuit are separated from each other by the inductor in the high frequency range. Therefore, a reduction in the base current is suppressed, and an increase in the collector current and the collector voltage, which is caused by the reduction in the base current, is suppressed. Therefore, the deterioration of, and damages to, the transistor is prevented from occurring due to the instant increase in the collector current and the collector voltage.

In the transistor integrated circuit apparatus according to the first embodiment, the transistors are separated from each other by the inductor in the high frequency range. Owing to this configuration, the reduction in the gain caused by coupling of the transistors or the like and the deterioration of other transistor amplification characteristics can be prevented especially while the apparatus is operating in the RF band. Thus, the operation of the transistors can be stabilized.

Figure 2:
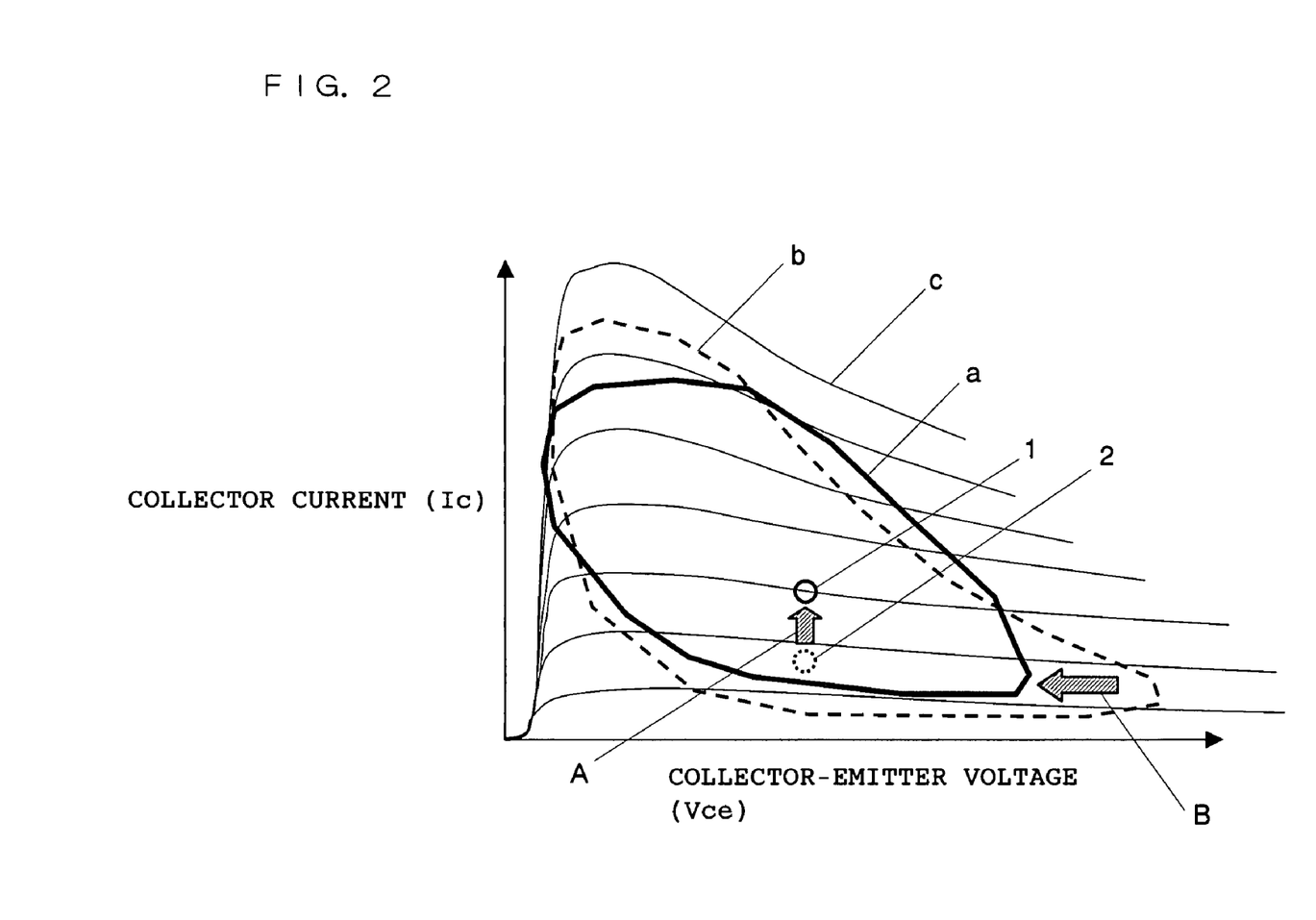
FIG. 2 is a graph illustrating a load line of the transistor integrated circuit apparatus according to the first embodiment of the present invention and a load line of a conventional power transistor circuit.

FIG. 2 shows a load line of the power transistor circuit using the transistor integrated circuit apparatus according to the first embodiment and a load line of the conventional power transistor circuit. In FIG. 2, curve "a" represents the load line of the power transistor circuit using the transistor integrated circuit apparatus according to the first embodiment, and curve "b" represents a load line of the conventional power transistor circuit when the base potential is lowered. Curve "c" represents the collector current with a parameter of base current. Reference numeral 1 represents a bias point of the power transistor circuit using the transistor integrated circuit apparatus according to the first embodiment, and reference numeral 2 represents a bias point of the conventional power transistor circuit when the base potential is lowered.

In the power transistor circuit using the transistor integrated circuit apparatus according to the first embodiment, as indicated by arrow A in FIG. 2, a reduction in the bias point can be suppressed. As represented by arrow B, the peak value of the amplitude of the collector voltage can be lowered. Thus, the transistor integrated circuit apparatus according to the first embodiment can prevent the deterioration of, and the damages to, the transistors.

Next, an inductor used in the transistor integrated circuit apparatus according to the first embodiment will be described. The frequency band of an RF signal which is input to the transistor integrated circuit apparatus is, for example, 1 GHz through 5 GHz. The inductance of an inductor used for a matching circuit or the like in this frequency band is usually about several nanohertz to about several ten nanohertz. In this transistor integrated circuit apparatus, the inductor is formed on the semiconductor substrate. Therefore, an inductor having an inductance exceeding 10 nH would occupy an impractically large area of the semiconductor substrate. Accordingly, the upper limit of the inductance of the inductor is about 10 nH. Since ordinary lines and wires also have an inductance, the lower limit of the inductance of the inductor is about 0.1 nH.

As described above, the transistor integrated circuit apparatus according to the first embodiment includes the transistors Tr11 through Tr1$n$ each having a collector electrode commonly connected to the RF output terminal RFout, the capacitors C11 through C1$n$ each having one end commonly connected to the RF signal input terminal RFin and the other end connected to the base electrode of the corresponding transistor, and the inductors L11 through L1$n$ each having one end commonly connected to the DC power supply input terminal DCin and the other end connected to the base electrode of the corresponding transistor. Owing to such a configuration, RF noise generated in the DC power supply circuit is reduced by the inductors L11 through L1$n$, and thus the RF noise output from the transistors Tr11 through Tr1$n$ can be reduced. The inductors L11 through L1$n$ prevent an RF signal input from the RF signal input terminal RFin from flowing toward the DC power supply circuit. Thus, the RF signal can be prevented from being lost by the flow thereof toward the DC power supply circuit.

Figure 1B:
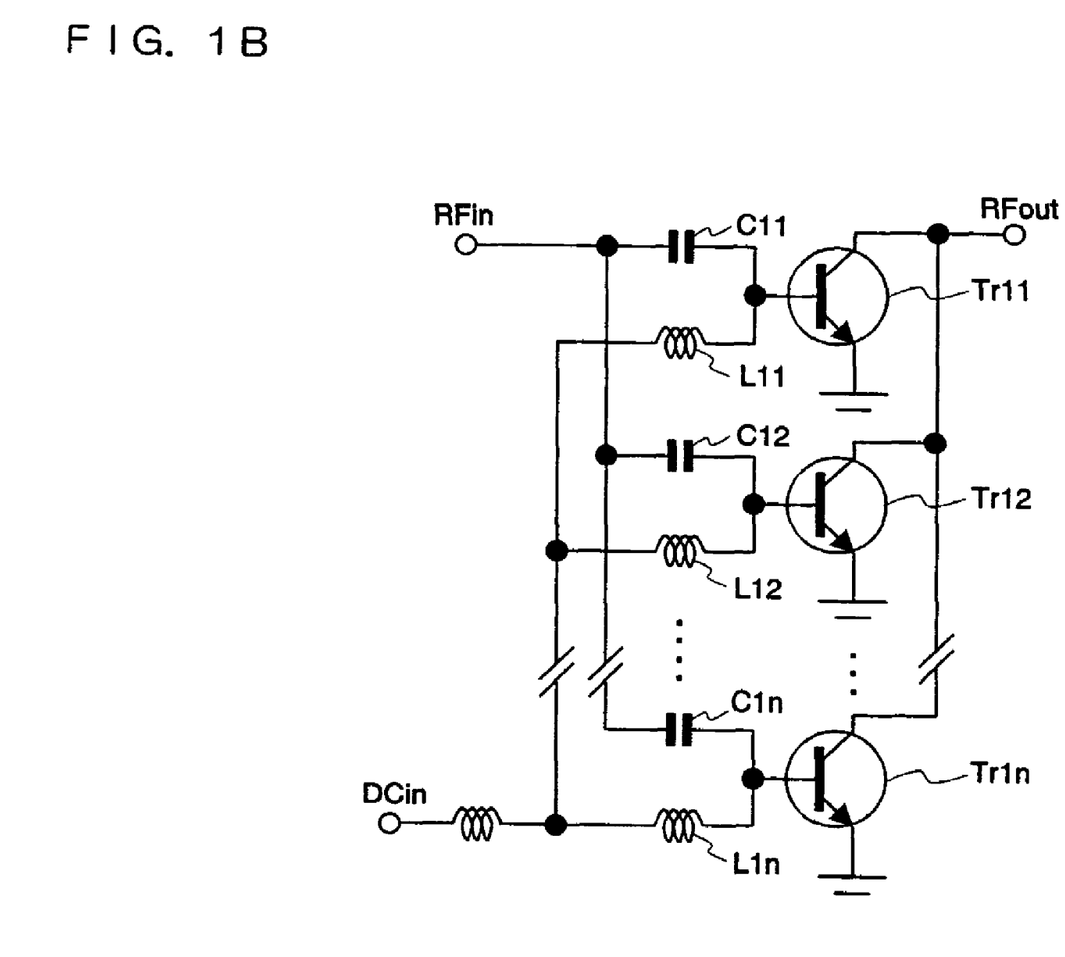

In the transistor integrated circuit apparatus according to the first embodiment, the base electrode of each of the transistor Tr11 through Tr1$n$ and the DC power supply circuit are separated from each other by the corresponding inductor among the inductors L11 through L1$n$ in the high frequency range. Therefore, a reduction in the base potential is suppressed when the amplitude of the output signal is excessively large, and an accompanying increase in the collector current and the collector voltage can be suppressed. Thus, one problem of the conventional power transistor circuit, i.e., the deterioration of, and the damages to, the transistors caused by the increase in the collector current and the collector voltage, can be prevented. In order to further enhance the effect provided by separating the DC power supply circuit and the base electrode of each transistor in the high frequency range, as shown in FIG. 1B, another inductor may be provided between the inductors L11 through L1$n$ and the DC power supply circuit.

Such an additional inductor may be formed on the semiconductor substrate even if an area thereof is somewhat large, unlike the inductor connected to each transistor. Accordingly, a preferable inductance of the inductor may be about 20 nH. The inductance is preferably equal to or greater than 1 nH because when the inductance is less than 1 nH, the separation of the RF noise cannot be expected.

Second Embodiment

Figure 3:
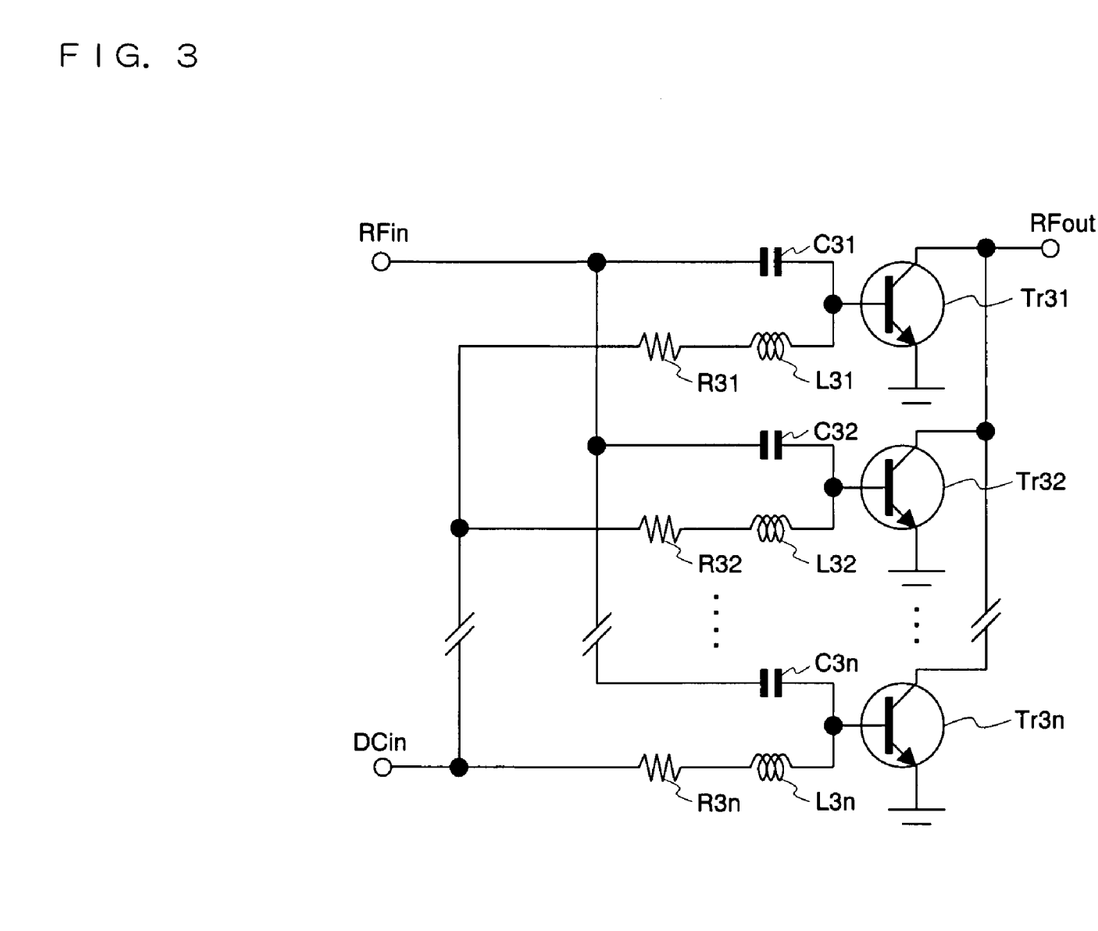
FIG. 3 shows an equivalent circuit configuration of a transistor integrated circuit apparatus according to a second embodiment of the present invention.

Next, a transistor integrated circuit apparatus according to a second embodiment of the present invention will be described. The transistor integrated circuit apparatus according to the second embodiment is different from the transistor integrated circuit apparatus according to the first embodiment in using a metal thin film as a material of the inductors. By using a metal for the inductors, the inductor obtains a resistance component. FIG. 3 shows an equivalent circuit of the transistor integrated circuit apparatus according to the second embodiment.

The transistor integrated circuit apparatus shown in FIG. 3 includes n number of transistors Tr31 through Tr3$n$, n number of capacitors C31 through C3$n$, n number of inductors L31 through L3$n$, and n number of bias resistors R31 through R3n. The bias resistors R31 through R3n are resistance components of the inductors L31 through L3n. In the following description, the transistor Tr31, the capacitor C31, the inductor L31 and the bias resistor R31 will be used to describe the transistor integrated circuit apparatus according to the second embodiment.

In the transistor integrated circuit apparatus according to the second embodiment, the inductor L31 has the bias resistor R31 as a resistance component thereof. Owing to such a configuration, an increase in the base current of the transistor is suppressed even when the temperature of the transistor is excessively raised. Thus, thermal runaway of the transistors caused by the variance among the transistors can be prevented.

Since each transistor includes a bias resistor, the transistors are better separated from one another. Therefore, the reduction in the gain caused by coupling of the transistors or the like can be prevented more efficiently.

In the case where the resistance of the bias resistor R31 and the inductance of the inductor L31 are set to appropriate values when designing the transistor integrated circuit apparatus, noise of a specific frequency can be reduced, and also the stability of the operation of the transistor integrated circuit apparatus can be improved.

In the case where the inductor L31 is formed of a material, the resistance of which is increased along with the temperature, i.e., in the case where the resistance of the bias resistor R31 has a positive temperature coefficient, thermal runaway of the transistors caused by the variance among the transistors can be suppressed more efficiently.

Next, a preferable range of the Q value of the inductor will be described. The frequency band of an RF signal which is input to the transistor integrated circuit apparatus according to the second embodiment is, for example, in the range of 1 GHz to 5 GHz. Accordingly, the parameters for determining the Q value of the inductor are set as follows: the frequency band of 1 GHz to 5 GHz, the inductance of the inductor of 0.1 nH to 10 nH, and the resistance component of the inductor of 50 Ω to 200 Ω. The range of 50 Ω to 200 Ω is effective as a ballast resistance. From these conditions, the Q value of the inductor is in the range of 0.00314 to 6.28. However, an inductor having an excessively small Q value is almost equivalent to a resistor and cannot be expected to act as an inductor. Therefore, where the lower limit is set to a value in accordance with the common knowledge, a preferable range of the Q value of the inductor is about 0.1 to about 1.0.

Next, an upper limit of the film thickness of the inductor will be obtained. In the case where the inductor is to be formed of, for example, gold, the thickness of the inductor is obtained as follows. The resistivity of gold is $2.4 \times 10^{-8}$ Ω·m. An inductor having a width of 2.4 μm, a length of 100 μm and a thickness of 1 μm has a resistance value of 1 Ω, which is too small to provide an effect as a ballast resistance. Therefore, the thickness of the inductor is preferably less than 1 μm.

As described above, the transistor integrated circuit apparatus according to the second embodiment includes inductors formed of a metal and therefore having a resistance component. Since the resistance component acts as a bias resistor, an increase in the base current of each transistor is suppressed even when the temperature of the transistor is excessively raised. Therefore, thermal runaway of the transistors caused by the variance among the transistors can be prevented. Owing to the resistor component of each inductor, the transistors are better separated from one another. Therefore, the reduction in the gain caused by coupling of the transistors or the like can be prevented more efficiently.

The inductor L31 may be formed of the same metal as that of the capacitor C31 and thus integrally formed with the capacitor C31. This can reduce the size of the circuit.

The inductor L31 may be formed of any material other than metal as long as the resistance value of the material has a positive temperature coefficient.

While the invention has been described in detail, the foregoing description is in all aspects illustrative and not restrictive. It is understood that numerous other modifications and variations can be devised without departing from the scope of the invention.

What is claimed is:

1. A transistor integrated circuit apparatus having an integrated circuit on a semiconductor substrate, the transistor integrated circuit apparatus comprising:
   at least one transistor having a first electrode connected to a common output terminal and a second electrode which is grounded;
   at least one capacitor having one of two electrodes connected to a base electrode of the transistor and the other electrode connected to a common RF signal input terminal; and
   at least one inductor having one of two electrodes connected to the base of the transistor and the other electrode connected to a DC power supply input terminal,
   wherein the inductor has a sufficient resistance component as a bias resistor and the inductor is formed of a material having a resistivity which has a positive temperature coefficient.

2. A transistor integrated circuit apparatus according to claim 1, wherein the inductor is formed of a metal thin film.

3. A transistor integrated circuit apparatus according to claim 2, wherein at least one of the inductor and at least one of the capacitor corresponding to each other are integrally formed of the same metal.

4. A transistor integrated circuit apparatus according to claim 1, further comprising another inductor between at least one of the inductor and a DC power supply circuit for supplying a DC power supply.

* * * * *